United States Patent [19]
Lee et al.

[11] Patent Number: 5,696,498
[45] Date of Patent: Dec. 9, 1997

[54] ADDRESS ENCODING METHOD AND ADDRESS DECODING CIRCUIT THEREFOR

[75] Inventors: Jun Ho Lee, Seoul; Seong Jae Cho, Kyungki-do, both of Rep. of Korea

[73] Assignee: Samsung Electronics Co., Ltd., Suwon, Rep. of Korea

[21] Appl. No.: 937,751

[22] Filed: Sep. 1, 1992

[30] Foreign Application Priority Data

Jan. 9, 1992 [KR] Rep. of Korea .................. 92-182

[51] Int. Cl.⁶ ............................................. H03K 3/00
[52] U.S. Cl. ............................................. 340/825.52
[58] Field of Search .................. 340/825.52, 825.53, 340/825.07, 825.02, 825.03, 825.1, 825.21, 825.84, 825.51, 825.87; 370/67, 119, 359, 427, 542, 544, 362, 536; 341/26; 307/239, 241, 242, 445; 371/10.1, 10.2, 10.3; 395/166, 311, 312

[56] References Cited

U.S. PATENT DOCUMENTS

| | | | |
|---|---|---|---|
| 3,903,499 | 9/1975 | Oliver | 340/825.52 |
| 4,570,154 | 2/1986 | Kinghorn et al. | 341/26 |
| 4,571,587 | 2/1986 | Higginbotham et al. | 340/825.53 |
| 4,716,410 | 12/1987 | Nozaki | 340/825.52 |
| 5,208,781 | 5/1993 | Matsushima . | |

OTHER PUBLICATIONS

IBM, Technical Disclosure Bulletin vol. 32 No. 11, Apr. 1990, USA, "Advanced Synchronous Data Link Control".
Texas Instruments, *The TTL DataBook*, Second Edition; 1976; USA; pp. 7–157 to 7–158g "Data Selectors/Multiplexers"; pp. 7–165 to 7–166, Dual 4–Line–to–1–Line Data Selectors/Multiplexers; pp. 7–175 to 7–176, Dual 2–Line–to–4–Line Decoders/Demultiplexers; pp. 7–181 to 7–183, Quadruple 2–Line–to–1 Line Data Selectors/Multiplexers.
Texas Instruments, "*Supplement to The TTL Data Book*", Second Edition; 1981; USA; pp. 19–22, 3–Line–to 8–Line Decoders/Demultiplexers with Address Latches.

*Primary Examiner*—Alyssa H. Bowler
*Assistant Examiner*—Mark H. Rinehart
*Attorney, Agent, or Firm*—Robert E. Bushnell, Esq.

[57] ABSTRACT

An address encoding method and an address decoding circuit therefor is disclosed. In the address encoding method, a part of the outputs of address latches are made to designate circuits to be controlled, and the rest of the outputs are made to designate the relevant addresses of the circuits to be controlled. Based on this method, the constitution of the decoding circuit becomes simple.

18 Claims, 3 Drawing Sheets

ADDRESS ENCODING METHOD AND ADDRESS DECODING CIRCUIT THEREFOR

FIELD OF THE INVENTION

The present invention relates to a system for controlling various circuits or blocks by utilizing a control bus, and more particularly to, an address encoding method and an address decoding circuit therefor, in which addresses are assigned by dividing an address part into two parts, i.e., a part for designating various circuits and blocks to be controlled and another part for designating the address of various circuits and blocks to be controlled, thereby simplifying the constitution of the address decoding hardware in transmitting addresses and data.

BACKGROUND OF THE INVENTION

FIG. 1 illustrates the constitution of a normal control bus, and, if an ID (identity) is in a low state, it represents an address, while, if the ID is in a high state, it represents data. When assigning addresses, the level of complexity of the hardware differs depending on the address encoding method.

For example, if the hardware to be controlled consists of three circuits, and if the contents of the respective circuits consist of four units, then 12 addresses are required assuming that each of the addresses includes AD1–AD9, ADA, ADB and ADC.

An address decoding circuit for the hardware to be controlled is constituted as illustrated in FIG. 1. That is, it includes 25 inverters, 12 4-input AND gates AND1–AND12, and therefore, its constitution becomes considerably complicated.

Therefore, a simpler address decoding circuit has been in demand.

SUMMARY OF THE INVENTION

The present invention is intended to overcome the above described disadvantages of the conventional techniques.

It is therefore an object of the present invention to provide an address encoding method in which the address encoding is carried out by dividing the address part into two parts, i.e., a part for designating the circuits or blocks to be controlled, and another part for designating the addresses of the circuits or blocks to be controlled.

It is an another object of the present invention to provide an address decoding circuit for address encoding, in which the decoding hardware is differently constituted in accordance with the address encoding method, the address encoding method being carried out by dividing the address part into two parts, i.e., a part for designating the circuits or blocks to be controlled, and another part for designating the addresses of the circuits or blocks to be controlled.

The address encoding method according to the present invention is characterized in that a part of the outputs of address latches designates the circuits to be controlled, and the rest of the outputs of the address latches designates the relevant addresses of the circuits to be controlled.

The address decoding circuit according to the present invention includes address latches and a plurality of AND gates for providing address decoding signals based on the combinations of the outputs of the address latches in which outputs of the address latches are divided into two parts, and one of the parts is connected to one set of input terminals of the plurality of the AND gates so as to select the circuit to be controlled, while the other part of the output is connected to another set of the input terminals of the plurality of the AND gates so as to designate the relevant address of the circuit to be controlled and selected by the one part.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1:
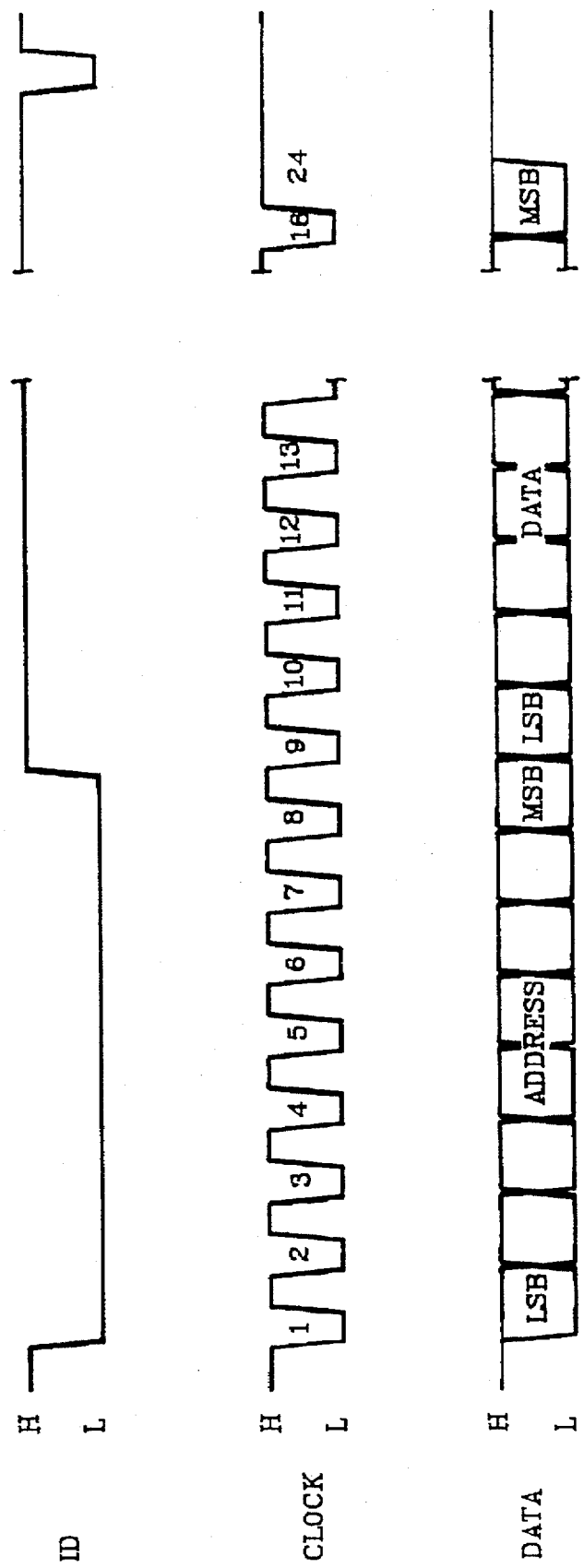
FIG. 1 illustrates a constitution of a conventional control bus.
Figure 2:
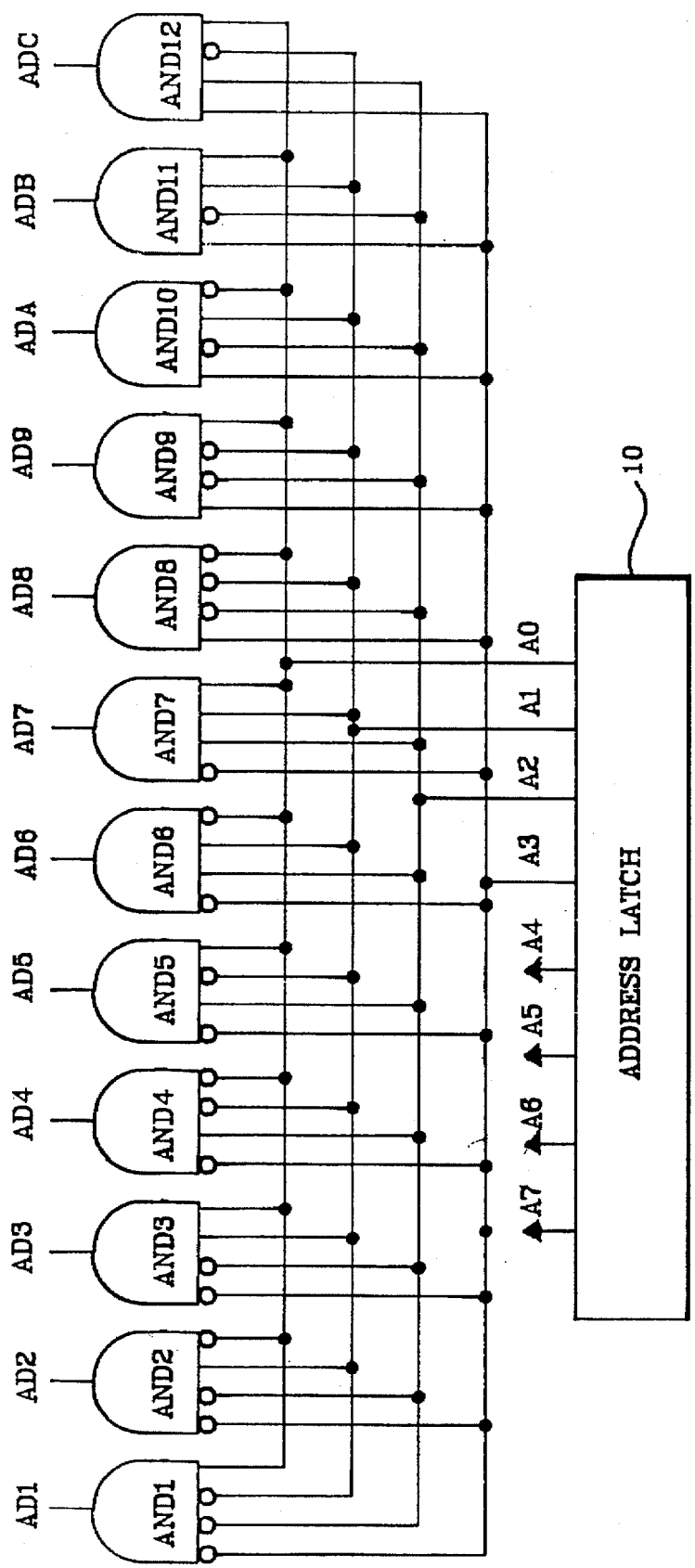
FIG. 2 illustrates a conventional decoding circuit.
Figure 3:
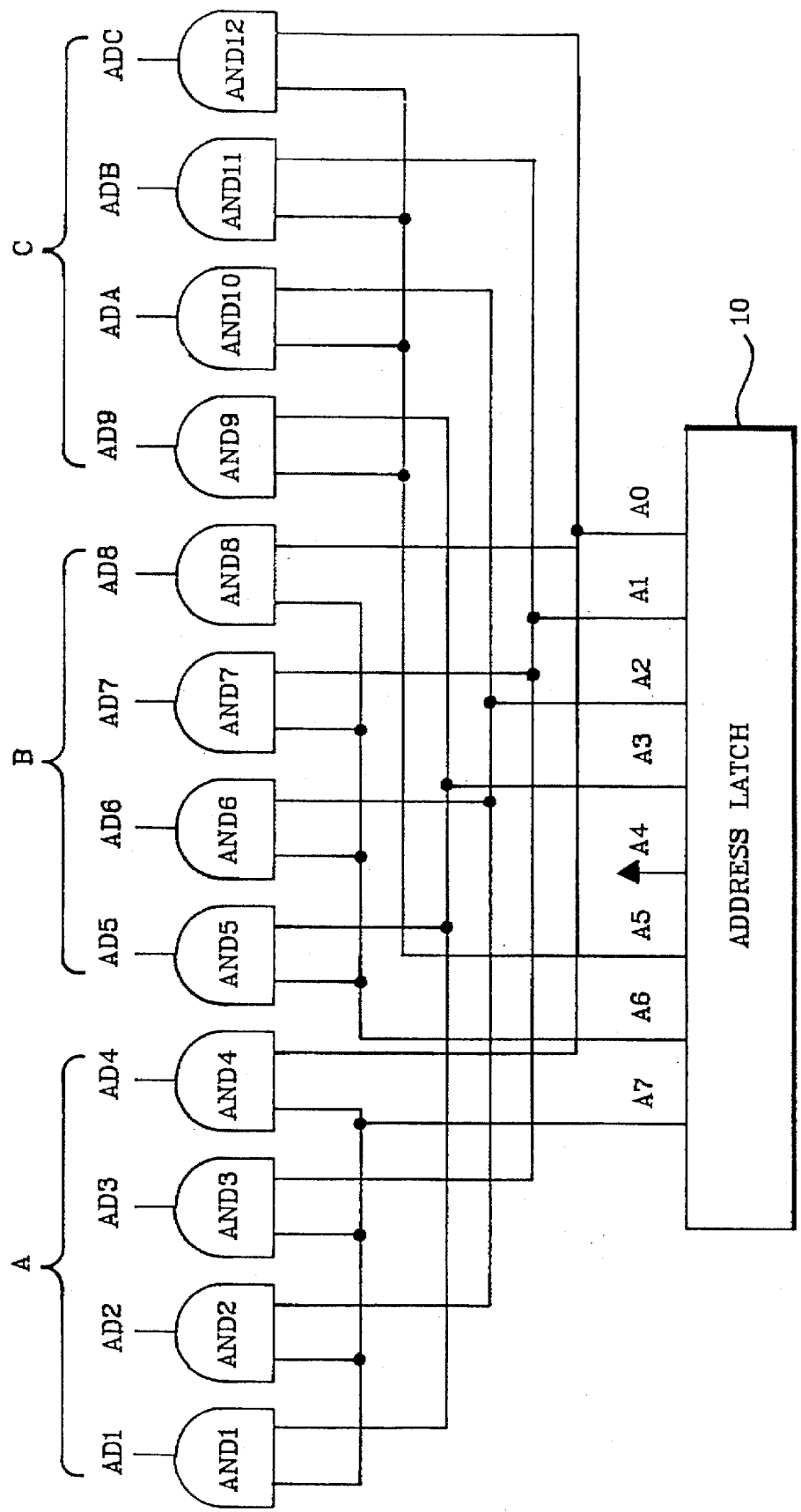
FIG. 3 illustrates an address decoding circuit for the address encoding method according to the present invention.

FIG. 3 illustrates an address decoding circuit for the address encoding method of the present invention, in which the number of circuits to be controlled is 3, while the number of control contents of each circuit to be controlled is 4. The fact that the circuit comprises a plurality of AND gates AND1–AND12, which output address decoding signals based on an output combination of an address latch 10, is the same as prior arts. However, as for the AND gates AND1–AND12, whereas 4-input AND gates have been used in the circuit of the prior arts, 2-input AND gates are used in the present invention. The connection method for the AND gates of the present invention is described below.

First, the outputs of the address latch 10 are divided into two parts, in which one of the parts is connected to one set of input terminals of the plurality of AND gates AND1–AND12 so as to select the circuit to be controlled, while the other part is connected to another set of input terminals of the plurality of AND gates AND1–AND12 so as to designate the relevant address of the circuit to be controlled, selected by the former part.

In the present invention constituted as described above, the three circuits to be controlled are represented by A, B and C, and their outputs of the latch 10 are represented by A0, A1, A2, ... A7. Further, A7, A6 and A5 designate the circuits A, B and C respectively, while A3, A2, A1 and A0 designate the addresses of the circuits.

Further, AD1, AD2, AD3 and AD4 are addresses belonging to the circuit A, and AD5, AD6, AD7 and AD8 are addresses belonging to the circuit B, while AD9, ADA, ADB and ADC are addresses belonging to the circuit C.

The address A3 designates the first addresses AD1, AD5 and AD9 of the circuits A, B and C to be controlled, and the address A2 designates the second addresses AD2, AD6 and AD10 of the circuits A, B and C to be controlled. Further the address A1 designates the third addresses AD3, AD7 and AD8 of the circuits A, B and C to be controlled, and the address A0 designates the fourth addresses AD4, AD8 and ADC of the circuits A, B and C to be controlled.

Based on the above assumption, if the address A7 for designating the circuit A is first made to be in a high state, and if the address A1 for designating the third addresses of the respective circuits is made to be in a high state, the third address AD3 of the circuit A is designated.

Further, if the address A6 for designating the circuit B is first made to be in a high state, and if the address A3 for designating the first address of the respective circuits is made to be in a high state, the first address AD5 of the circuit B is designated.

The address of the circuit C can also be designated in the same manner. The relationships between the output addresses of the address latch 10 for designating the addresses of the respective circuits and the addresses of the respective circuits which are the outputs from the decoding circuits are as shown in Table 1 below.

TABLE 1

| Circuits to be controlled | Addresses of circuits to be controlled | Circuit designating part | | | Address designating part | | | |
|---|---|---|---|---|---|---|---|---|
| | | A7 | A6 | A5 | A4 | A3 | A2 | A1 | A0 |
| A | AD1 | 1 | 0 | 0 | X | 1 | 0 | 0 | 0 |
|   | AD2 | 1 | 0 | 0 | X | 0 | 1 | 0 | 0 |
|   | AD3 | 1 | 0 | 0 | X | 0 | 0 | 1 | 0 |
|   | AD4 | 1 | 0 | 0 | X | 0 | 0 | 0 | 1 |
| B | AD5 | 0 | 1 | 0 | X | 1 | 0 | 0 | 0 |
|   | AD6 | 0 | 1 | 0 | X | 0 | 1 | 0 | 0 |
|   | AD7 | 0 | 1 | 0 | X | 0 | 0 | 1 | 0 |
|   | AD8 | 0 | 1 | 0 | X | 0 | 0 | 0 | 1 |
| C | AD9 | 0 | 0 | 1 | X | 1 | 0 | 0 | 0 |
|   | ADA | 0 | 0 | 1 | X | 0 | 1 | 0 | 0 |
|   | ADB | 0 | 0 | 1 | X | 0 | 0 | 1 | 0 |
|   | ADC | 0 | 0 | 1 | X | 0 | 0 | 0 | 1 |

In the above table, X represents "don't care".

As described above, A7, A6, and A5 represent the addresses for designating the circuit to be controlled, while A3, A2, A1 and A0 show which addresses of the respective circuits they are, and therefore if 4 control contents and 3 circuits to be controlled are included, 12 addresses can be simply designated by using twelve 2-input AND gates AND1–AND12.

Besides the case where 12 addresses are required, the application of the circuit of the present invention can be extended, if the outputs from the address latches are combined into a different scale by adjusting the number of the AND gates in accordance with the number of the control contents of the circuits to be controlled, and by varying the connection between the and gates and the outputs of the address latch.

According to the present invention as described above, the address part is divided into two parts, i.e., a part for designating the circuits to be controlled, and the other part for designating the relevant addresses of the circuits. Thus, the address decoding circuit is constituted in accordance with the address assigning method, thereby simplifying the constitution of the address decoding circuit.

What is claimed is:

1. An address decoding circuit, comprising:
  address latch means for generating first, second, third, fourth, fifth, sixth and seventh latching signals for designating selected ones of a plurality of circuits and corresponding addresses of the selected ones of said plurality circuits to be controlled;
  a first group of logic gates, responsive to said first, second, third, fourth and seventh latching signals, for generating first, second, third and fourth addresses representative of addresses of a first one of said plurality of circuits;
  a second group of logic gates, responsive to said first, second, third, fourth and sixth latching signals, for generating fifth, sixth, seventh and eighth addresses representative of addresses of a second one of said plurality of circuits; and
  a third group of logic gates, responsive to said first, second, third, fourth and fifth latching signals, for generating ninth, tenth, eleventh and twelfth addresses representative of addresses of a third one of said plurality of circuits.

2. The address decoding circuit as claimed in claim 1, wherein said first group of logic gates comprises:
  a first AND gate for logically combining said fourth and said seventh latching signals to provide said first address of said first one of said plurality of circuits;
  a second AND gate for logically combining said third and said seventh latching signals to provide said second address of said first one of said plurality of circuits;
  a third AND gate for logically combining said second and said seventh latching signals to provide said third address of said first one of said plurality of circuits; and
  a fourth AND gate for logically combining said first and said seventh latching signals to provide said fourth address of said first one of said plurality of circuits.

3. The address decoding circuit as claimed in claim 2, wherein said second group of logic gates comprises:
  a fifth AND gate for logically combining said fourth and said sixth latching signals to provide said fifth address of said second one of said plurality of circuits;
  a sixth AND gate for logically combining said third and said sixth latching signals to provide said sixth address of said second one of said plurality of circuits;
  a seventh AND gate for logically combining said second and said sixth latching signals to provide said seventh address of said second one of said plurality of circuits; and
  a eighth AND gate for logically combining said first and said sixth latching signals to provide said eighth address of said second one of said plurality of circuits.

4. The address decoding circuit as claimed in claim 3, wherein said third group of logic gates comprises:
  a ninth AND gate for logically combining said fourth and said fifth latching signals to provide said ninth address of said third one of said plurality of circuits;
  a tenth AND gate for logically combining said third and said fifth latching signals to provide said tenth address of said third one of said plurality of circuits;
  a eleventh AND gate for logically combining said second and said fifth latching signals to provide said eleventh address of said third one of said plurality of circuits; and
  a twelfth AND gate for logically combining said first and said fifth latching signals to provide said twelfth address of said third one of said plurality of circuits.

5. The address decoding circuit as claimed in claim 4, wherein each of said first, second, third, fourth, fifth, sixth, seventh, eighth, ninth, tenth, eleventh and twelfth AND gates is a two-input AND gate.

6. The address decoding circuit as claimed in claim 5, wherein said fifth, sixth and seventh latching signals are generated to respectively designate said first, second and third ones of said plurality of circuits, and said first, second, third and fourth latching signals are generated to designate corresponding addresses for each of said first, second and third ones of said plurality of circuits.

7. An address decoding circuit, comprising:
  address latch means for providing a plurality of latching signals for addressing a plurality of circuits;
  a first group of logic gates, responsive to first, second, third, fourth and seventh ones of said plurality of latching signals, for generating first, second, third and fourth addresses representative of addresses of a first designated circuit from said plurality of circuits;

a second group of logic gates, responsive to said first, second, third and fourth ones and to a sixth one of said plurality of latching signals, for generating fifth, sixth, seventh and eighth addresses representative of addresses of a second designated circuit from said plurality of circuits; and a third group of logic gates, responsive to said first, second, third and fourth ones and to a fifth one of said plurality of latching signals, for generating ninth, tenth, eleventh and twelfth addresses representative of addresses of a third designated circuit from said plurality of circuits.

8. The address decoding circuit as claimed in claim 7, wherein said seventh, sixth and fifth ones of said plurality of latching signals are provided to designate said first, second and third designated circuits from said plurality of circuits, respectively, and said first, second, third and fourth ones of said plurality of latching signals are provided to designate corresponding addresses of said first, second and third designated circuits.

9. The address decoding circuit as claimed in claim 8, wherein said first group of logic gates comprises:

a first AND gate having a first input terminal coupled to receive said fourth latching signal and a second input terminal coupled to receive said seventh latching signal, for logically combining said fourth and said seventh latching signals to provide said first address of said first designated circuit;

a second AND gate having a first input terminal coupled to receive said third latching signal and a second input terminal coupled to receive said seventh latching signal, for logically combining said third and said seventh latching signals to provide said second address of said first designated circuit;

a third AND gate having a first input terminal coupled to receive said second latching signal and a second input terminal coupled to receive said seventh latching signal, for logically combining said second and said seventh latching signals to provide said third address of said first designated circuit; and a fourth AND gate having a first input terminal coupled to receive said first latching signal and a second input terminal coupled to receive said seventh latching signal, for logically combining said first and said seventh latching signals to provide said fourth address of said first designated circuit.

10. The address decoding circuit as claimed in claim 9, wherein said second group of logic gates comprises:

a fifth AND gate having a first input terminal coupled to receive said fourth latching signal and a second input terminal coupled to receive said sixth latching signal, for logically combining said fourth and said sixth latching signals to provide said fifth address of said second designated circuit;

a sixth AND gate having a first input terminal coupled to receive said third latching signal and a second input terminal coupled to receive said sixth latching signal, for logically combining said third and said sixth latching signals to provide said sixth address of said second designated circuit;

a seventh AND gate having a first input terminal coupled to receive said second latching signal and a second input terminal coupled to receive said sixth latching signal, for logically combining said second and said sixth latching signals to provide said seventh address of said second designated circuit; and a eighth AND gate having a first input terminal coupled to receive said first latching signal and a second input terminal coupled to receive said sixth latching signal, for logically combining said first and said sixth latching signals to provide said eighth address of said second designated circuit.

11. The address decoding circuit as claimed in claim 10, wherein said third group of logic gates comprises:

a ninth AND gate having a first input terminal coupled to receive said fourth latching signal and a second input terminal coupled to receive said fifth latching signal, for logically combining said fourth and said fifth latching signals to provide said ninth address of said third designated circuit;

a tenth AND gate having a first input terminal coupled to receive said third latching signal and a second input terminal coupled to receive said fifth latching signal, for logically combining said third and said fifth latching signals to provide said tenth address of said third designated circuit;

a eleventh AND gate having a first input terminal coupled to receive said second latching signal and a second input terminal coupled to receive said fifth latching signal, for logically combining said second and said fifth latching signals to provide said eleventh address of said third designated circuit; and a twelfth AND gate having a first input terminal coupled to receive said first latching signal and a second input terminal coupled to receive said fifth latching signal, for logically combining said first and said fifth latching signals to provide said twelfth address of said third designated circuit.

12. An address encoding method in a system having an address latch for providing a plurality of output signals to a plurality of AND gates, said method comprising the steps of:

partitioning said plurality of AND gates into a plurality of different circuits;

generating a first quantity of said plurality of output signals from said address latch, each one of said first quantity of output signals designating a corresponding different one of said plurality of circuits to be controlled;

generating a second quantity of said plurality of output signals from said address latch, each one of said second quantity of output signals designating a single corresponding AND gate within each of said plurality of circuits to be controlled; and generating a plurality of address decoding signals by logically combining each one of said first quantity of output signals with a corresponding one of said second quantity of output signals.

13. The address encoding method as claimed in claim 12, further comprised of generating three electrical signals as said first quantity of said plurality of output signals and generating four electrical signals as said second quantity of said plurality of output signals.

14. The address encoding method as claimed in claim 12, further comprised of partitioning said plurality of AND gates into three separate electrical circuits.

15. The address encoding method as claimed in claim 12, further comprised of each of said plurality of AND gates receiving one of said first quantity of said plurality of output signals and one of said second quantity of said plurality of output signals.

16. The address encoding method as claimed in claim 13, further comprised of each of said plurality of AND gates receiving one of said first quantity of said plurality of output signals, and one of said second quantity of said plurality of output signals.

17. The address encoding method as claimed in claim 13, further comprised of partitioning said plurality of AND gates into three separate electrical circuits.

18. An address encoding method in a system having an address latch for providing a plurality of output signals to a plurality of AND gates, said method comprising the steps of:

partitioning said plurality of AND gates into a plurality of different circuits;

generating a first quantity of said plurality of output signals from said address latch, each one of said first quantity of output signals designating a corresponding different one of said plurality of circuits to be controlled;

supplying each one of said first quantity of output signals to a first input terminal of every AND gate within the corresponding circuit;

generating a second quantity of said plurality of output signals from said address latch, each one of said second quantity of output signals designating a single corresponding AND gate within each of said plurality of circuits to be controlled;

supplying each one of said second quantity of output signals to a second input terminal of the corresponding AND gate; and generating a plurality of address decoding signals by logically combining each one of said first quantity of output signals with corresponding ones of said second quantity of output signals.

* * * * *